United States Patent
Chung et al.

(10) Patent No.: US 9,997,294 B2
(45) Date of Patent: Jun. 12, 2018

(54) ELECTRONIC COMPONENT AND CIRCUIT BOARD HAVING THE SAME

(71) Applicant: Samsung Electro-Mechanics Co., Ltd., Suwon-si, Gyeonggi-do (KR)

(72) Inventors: Hae Suk Chung, Suwon-si (KR); Kyung Pyo Hong, Suwon-si (KR); Mi Suk Lee, Suwon-si (KR); Min Hyang Kim, Suwon-si (KR); Kyeong Jun Kim, Suwon-si (KR); Tae Ho Song, Suwon-si (KR); Seung Hyun Ra, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/248,512

(22) Filed: Aug. 26, 2016

(65) Prior Publication Data

US 2017/0223832 A1    Aug. 3, 2017

(30) Foreign Application Priority Data

Feb. 3, 2016  (KR) .......................... 10-2016-0013360

(51) Int. Cl.
*H01G 4/30*      (2006.01)
*H01G 4/005*    (2006.01)
(Continued)

(52) U.S. Cl.
CPC .............. *H01G 4/005* (2013.01); *H01G 4/12* (2013.01); *H01G 4/2325* (2013.01);
(Continued)

(58) Field of Classification Search
CPC .......... B32B 15/02; H01G 4/005; H01G 4/12; H01G 4/30; H01G 4/0085; H01G 4/248;
(Continued)

(56) References Cited

U.S. PATENT DOCUMENTS

| | | | |
|---|---|---|---|
| 2007/0245852 A1* | 10/2007 | Takaoka ............. | B23K 35/0244 75/255 |
| 2008/0130198 A1 | 6/2008 | Nakano et al. | |
| 2008/0200812 A1* | 8/2008 | Osawa ..................... | A61B 8/12 600/459 |
| 2012/0208040 A1* | 8/2012 | Lien ........................ | H01G 4/30 428/552 |

(Continued)

FOREIGN PATENT DOCUMENTS

| | | | | |
|---|---|---|---|---|
| KR | 10-2007-0110401 A | | 11/2007 | |
| KR | 20070110401 A | * | 11/2007 | ............. H01C 1/148 |

(Continued)

OTHER PUBLICATIONS

Office Action Korean Patent Application No. 10-2016-0013360 dated Feb. 14, 2017 with full English translation.

*Primary Examiner* — Timothy Thompson
*Assistant Examiner* — Guillermo Egoavil
(74) *Attorney, Agent, or Firm* — McDermott Will & Emery LLP

(57) ABSTRACT

An electronic component includes a body including a dielectric material and an internal electrode embedded in the dielectric material, an external electrode disposed on the body and connected to the internal electrode, and a conductive adhesive connected to the external electrode. The external electrode and the conductive adhesive include a conductive resin. A circuit board includes the electronic component.

14 Claims, 8 Drawing Sheets

A

(51) Int. Cl.
   *H01G 4/232*   (2006.01)
   *H01G 4/12*    (2006.01)
   *H01G 4/248*   (2006.01)
   *H05K 3/32*    (2006.01)

(52) U.S. Cl.
   CPC ............... *H01G 4/248* (2013.01); *H01G 4/30* (2013.01); *H05K 3/321* (2013.01); *H05K 2201/10015* (2013.01); *H05K 2201/10636* (2013.01); *Y02P 70/611* (2015.11)

(58) Field of Classification Search
   CPC .... H01G 4/1227; H01G 4/2325; H05K 1/181; H05K 3/321; H05K 3/3442; H05K 2201/10015; H05K 2201/10636; Y10T 29/435; Y10T 428/12056; Y02P 70/611
   USPC ....... 29/25.42; 174/260; 361/301.4; 428/552
   See application file for complete search history.

(56) References Cited

U.S. PATENT DOCUMENTS

| | | | | |
|---|---|---|---|---|
| 2014/0061181 | A1* | 3/2014 | Sudo | G03G 15/2057 |
| | | | | 219/216 |
| 2015/0027764 | A1* | 1/2015 | Lee | H01G 4/30 |
| | | | | 174/260 |
| 2015/0068794 | A1* | 3/2015 | Kang | H01G 4/232 |
| | | | | 174/260 |
| 2015/0223334 | A1* | 8/2015 | Nakagawa | H05K 3/3442 |
| | | | | 174/258 |
| 2017/0345570 | A1* | 11/2017 | Sakatsume | H01G 4/012 |

FOREIGN PATENT DOCUMENTS

| | | |
|---|---|---|
| KR | 10-2008-0031962 A | 4/2008 |
| KR | 10-2015-0030450 A | 3/2015 |

* cited by examiner

A

ELECTRONIC COMPONENT AND CIRCUIT BOARD HAVING THE SAME

CROSS-REFERENCE TO RELATED APPLICATION

This application claims the priority and benefit of Korean Patent Application No. 10-2016-0013360, filed on Feb. 3, 2016, with the Korean Intellectual Property Office, the inventive concept of which is incorporated herein by reference.

TECHNICAL FIELD

The present disclosure relates to an electronic component and a circuit board having the same.

BACKGROUND

Small electronic components, such as capacitors, inductors, piezoelectric devices, varistors and thermistors, commonly include a body formed of a dielectric material, internal electrodes disposed in the body, with external electrodes disposed on a surface of the body and connected to the internal electrodes. Among such electronic components, a multilayer ceramic capacitor (MLCC) is widely used as an electronic component in mobile communication devices, such as computers, personal digital assistants (PDAs), and mobile phones due to inherent advantages thereof, such as small size, high capacitance, and ease of mounting.

In general, an MLCC is mounted on an electrode pad of a circuit board by soldering, and thereby electrically connected to another external circuit. Here, cracks may be generated in a body or a soldering material of the MLCC mounted on the circuit board due to deformation or warpage of a circuit board, changes in external temperature, and the like. Such cracks may cause serious problems, such as electrical short-circuits of the MLCC and the generation of a critical defect leading to firing of the circuit.

SUMMARY

An aspect of the present disclosure may provide an electronic component having a noble metal structure in which crack generation is reduced when the electronic component is mounted on a circuit board, and a circuit board having the same.

According to an aspect of the present disclosure, an external electrode and a conductive adhesive may be formed of a conductive resin.

According to another aspect of the present disclosure, an electronic component may include a body including a dielectric material and an internal electrode embedded in the dielectric material, an external electrode disposed on the body and connected to the internal electrode, and a conductive adhesive connected to the external electrode. The external electrode and the conductive adhesive include a conductive resin.

According to another aspect of the present disclosure, an electronic component-mounting circuit board may include a circuit board including a substrate and an electrode pad formed on the substrate, an electronic component including a body having a dielectric material and an internal electrode embedded in the dielectric material, and an external electrode connected to the internal electrode and disposed on the body, and a conductive adhesive configured to connect the electrode pad to the external electrode. The external electrode and the conductive adhesive include a conductive resin.

BRIEF DESCRIPTION OF DRAWINGS

The above and other aspects, features, and advantages will be more clearly understood from the following detailed description taken in conjunction with the accompanying drawings, in which.

DETAILED DESCRIPTION

Figure 1:
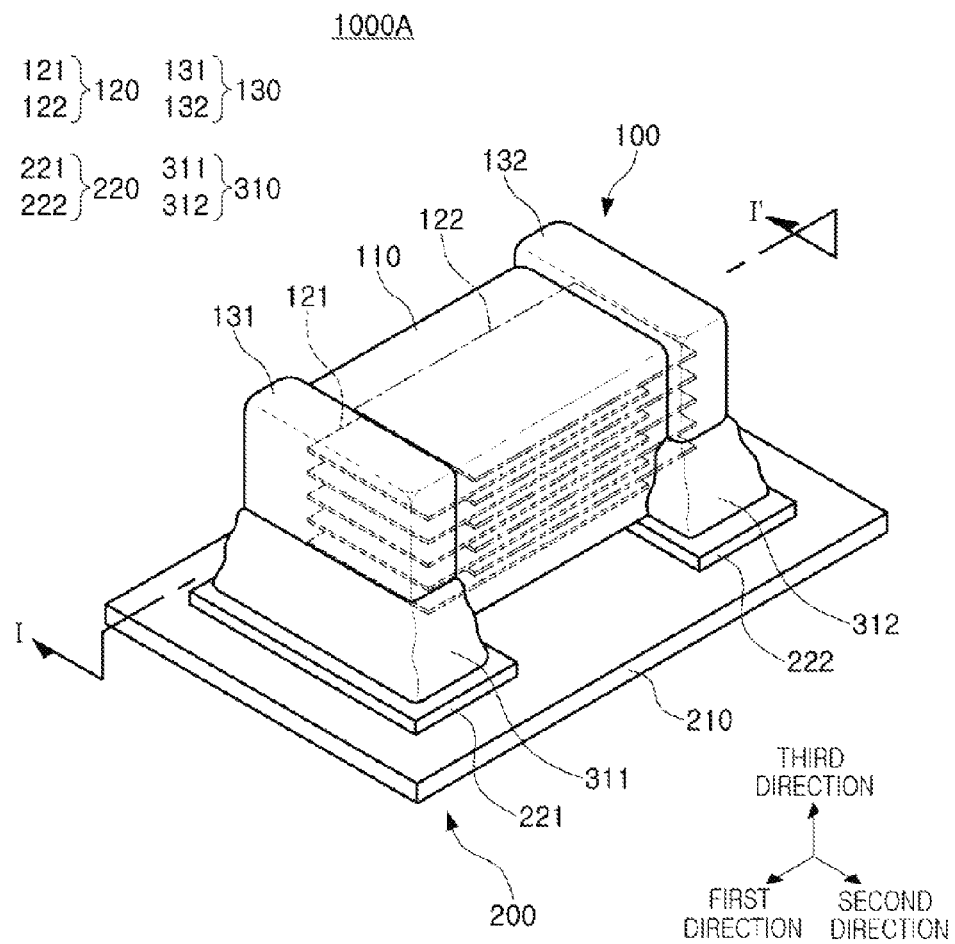
FIG. 1 is a perspective view schematically illustrating an electronic component-mounting circuit board according to an exemplary embodiment of the present disclosure.

Hereinafter, embodiments will be described as follows with reference to the attached drawings. In the drawings, shapes and sizes of components may be exaggerated or minimized for clarity.

Herein, while a multilayer ceramic capacitor (MLCC) structure will be exemplarily described as an electronic component for description purposes, the present inventive concept is not limited thereto. It is obvious that the embodiments disclosed herein will be applicable to small electronic components, such as capacitors, inductors, piezoelectric devices, varistors, or thermistors, in which cracks may occur when the electronic components are mounted on a circuit board.

FIG. 1 is a perspective view schematically illustrating an electronic component-mounting circuit board according to an exemplary embodiment of the present disclosure.

Figure 2:
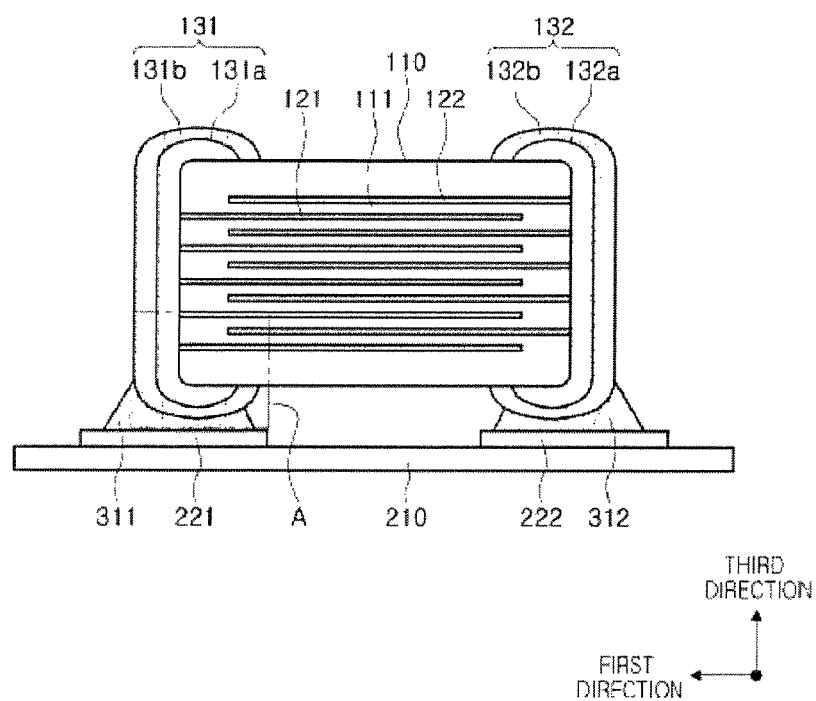
FIG. 2 is a schematic cross-sectional view taken along line I-I' of the electronic component-mounting circuit board in FIG. 1.

FIG. 2 is a schematic cross-sectional view taken along line I-I' of the electronic component-mounting circuit board in FIG. 1.

Figure 3:
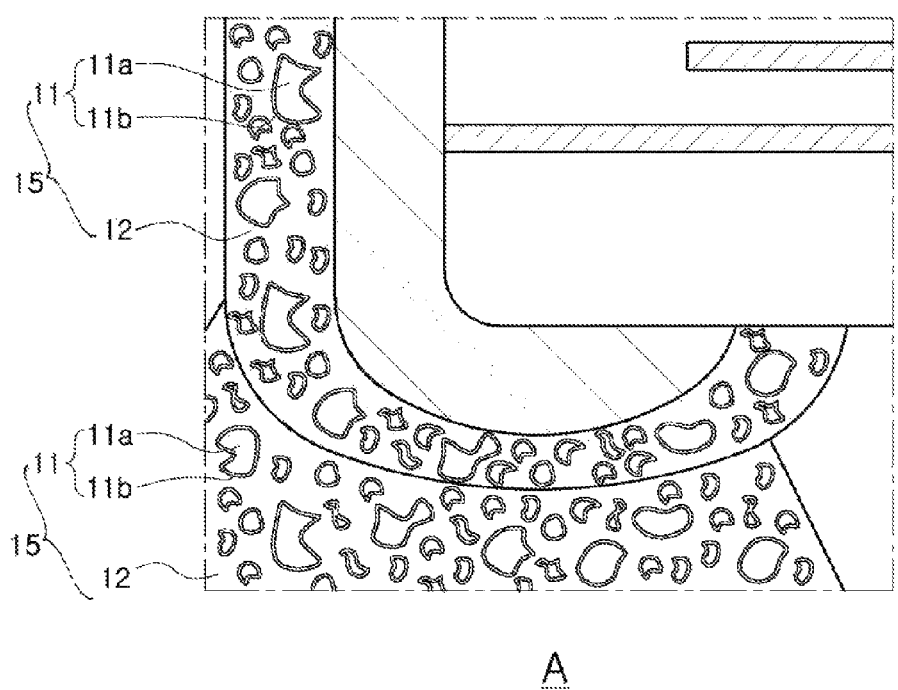
FIG. 3 is a schematic enlarged cross-sectional view of part A of the electronic component-mounting circuit board in FIG. 2.

FIG. 3 is a schematic enlarged cross-sectional view of part A of the electronic component-mounting circuit board in FIG. 2.

Referring to FIGS. 1 to 3, an electronic component-mounting circuit board 1000A according to an exemplary embodiment of the present disclosure includes a circuit board 200 including a substrate 210 and an electrode pad 220 formed on the substrate 210, an electronic component 100 including a body 110 which has a dielectric material 111 and an internal electrode 120 embedded in the dielectric material 111 and an external electrode 130 connected to the internal electrode 120 and disposed on the body 110, and a conductive adhesive 310 connecting the electrode pad 220 to the external electrode 130. Here, the external electrode 130 and the conductive adhesive 310 may include a conductive resin 15. The conductive resin 15 of the external electrode 130 may be in contact with that of the conductive adhesive 310.

Normally, an electronic component such as a multilayer ceramic capacitor (MLCC) may be mounted on an electronic pad of a circuit board by soldering as described above, and thereby electrically connected to another external circuit. The MLCC mounted on the circuit board is prone to cracks occurring in a body or a soldering material due to deformation or warpage of the circuit board, or changes in external temperature. Such cracks may cause a serious problem. For example, such a defect may electrically short circuit the MLCC, thereby generating a critical defect leading to malfunctioning of the circuit.

Meanwhile, the electronic component 100, such as an MLCC, according to the exemplary embodiment, may be mounted on the electrode pad 220 of the circuit board 200 not by the soldering material but by the conductive adhesive 310 including the conductive resin 15. In addition, the external electrode 130 connected to the conductive adhesive 310 may also include the conductive resin 15. Normally, stress generated in a soldering material may be a main cause of cracks occurring due to warpage of a circuit board. Since the electronic component-mounting circuit board 1000A according to the exemplary embodiment does not include the soldering material but includes the conductive resin 15, and the external electrode 130 connected to the conductive adhesive 310 includes the same material based conductive resin, such cracks generated due to warpage may be reduced and superior adhesion may be ensured. In addition, since the soldering material is not used, solder joint cracks generated by changes in temperature may be reduced, too. Further, since the soldering material is not used, the electronic component-mounting circuit board 1000A according to the exemplary embodiment may be utilized for applications at a temperature of 150° C. or more. In addition, since the soldering material is not used, acoustic noise may be advantageously reduced.

Hereinafter, a configuration of an electronic component-mounting circuit board will be described in more detail.

The electronic component 100 may include the body 110 including the dielectric material 111 and the internal electrode 120 embedded in the dielectric material 111, and the external electrode 130 disposed on the body 110 and connected to the internal electrode 120. In the disclosure, the conductive adhesive 310 may be a subcomponent of the electronic component 100. That is, the electronic component 100 may include the conductive adhesive 310.

The body 110 provides a basic shape of the electronic component 100. The shape of the body 110 is not specifically limited. For example, as illustrated in the drawings, the body 110 may have an approximately hexahedral shape. For example, the body 110 may include a first surface and a second surface opposing each other in a first direction, a third surface and a fourth surface opposing each other in a second direction and connecting the first surface to the second surface, and a fifth surface and a sixth surface opposing each other in a third direction and connecting the first surface to the second surface. Although the body 110 may not have a perfect hexahedral shape having straight lines due to burning shrinkage of the dielectric material 111 during a sintering process, the body 110 may substantially have the hexahedral shape.

The body 110 may be formed of a dielectric material 111. For example, the body 110 may be configured with a plurality of dielectric layers. The plurality of dielectric layers may be in a sintered state, and interfaces of adjacent dielectric layers may be blurred and hardly distinguished. The dielectric layers may be formed of a ceramic powder having a high dielectric constant. The ceramic powder may be, for example, $BaTiO_3$-based powder or $SrTiO_3$-based powder, but is not limited thereto. Here, it is obvious that another well-known ceramic powder could be used. The body 110 may be formed by forming a plurality of ceramic green sheets by applying a slurry including the ceramic powder on a carrier film and drying the slurry, forming the internal electrode 120 by printing a conductive paste including a conductive metal on each of the green sheets to a predetermined thickness and stacking the green sheets, stacking other green sheets on which the conductive paste is not printed, on a top and a bottom of the stacked green sheets, and sintering the resultant structure.

The internal electrode 120 embedded in the dielectric material 111 may be disposed in the body 110. The internal electrode 120 may be formed in such a manner that the conductive paste including the conductive metal is printed on the dielectric layers to the predetermined thickness as described above. The printed conductive paste including the conductive metal may be electrically insulated from each other by the dielectric layers disposed therebetween. The conductive metal may be formed of nickel (Ni), copper (Cu), palladium (Pd), or alloys thereof, but is not limited thereto.

The internal electrode 120 may include first internal electrodes 121 and second internal electrodes 122, alternately stacked with the dielectric material 111 therebetween. The first and second internal electrodes 121 and 122 may be respectively and alternately exposed on the first and second surfaces of the body 110 in the first direction, with the dielectric material 111 therebetween. The first and second internal electrodes 121 and 122 may overlap each other to form capacitance. Voltages having opposite polarities may be applied to the first and second internal electrodes 121 and 122 via first and second external electrodes 131 and 132 to be described later, respectively. However, such a configuration of the internal electrode 120 is merely exemplary, and is not limited thereto. That is, the internal electrode 120 may be arranged in other forms known in the art, as will be described later.

The external electrode 130 connected to the internal electrode 120 may be disposed on an exterior of the body 110. For example, the external electrode 130 may be formed by forming an electrode layer by coating a surface of the body 110 with a conductive paste including a Cu powder, a silver (Ag) powder, or the like, coating the electrode layer with a conductive resin compound, and curing the resultant structure. The electronic component 100 may be electrically connected to an external device via the external electrode 130.

The external electrode 130 may include first and second external electrodes 131 and 132, disposed to be spaced apart from each other on the body 110. The first and second external electrodes 131 and 132 may be disposed to cover the first and second surfaces of the body 110 in the first direction, respectively. The first and second external electrodes 131 and 132 may be connected to the first and second internal electrodes 121 and 122, respectively. Voltages having opposite polarities may be applied to the first and second internal electrodes 121 and 122 via the first and second external electrodes 131 and 132, respectively. However, such an arrangement of the external electrode 130 is merely exemplary, and is not limited thereto. That is, the external electrode 130 may be arranged in other forms known in the art, as will be described later.

The first and second external electrodes 131 and 132 may include first and second electrode layers 131a and 132a disposed to be spaced apart from each other on the body 110 and connected to the first and second internal electrodes 121 and 122, respectively. In addition, the first and second external electrodes 131 and 132 may include first and second resin layers 131b and 132b covering the first and second electrode layers 131a and 132a and connected to first and second conductive adhesives 311 and 312 to be described later, respectively.

The first and second electrode layers 131a and 132a may include a normal conductive material, such as gold (Au), Ag, Cu, platinum (Pt), aluminum (Al) or Ni. A representative material included in the first and second electrode layers 131a and 132a may be Cu, but is not limited thereto. The first and second electrode layers 131a and 132a may be formed by applying a conductive paste including a conductive material or plating a conductive material.

The first and second resin layers 131b and 132b may include a conductive resin, that is, a metal particle 11 and a base resin 12. The metal particle 11 may include a metal powder particle 11a coated with a noble metal or alloys thereof 11b. Such a metal powder particle 11a coated with the noble metal or alloy thereof 11b has an advantage of being usable at a high temperature of 150° C. or more with no problem. Here, the noble metal or alloy thereof 11b may include at least one of Au, Ag, Pt, ruthenium (Ru), rhodium (Rh), Pd, osmium (Os), and iridium (Ir), but is not limited thereto. The metal powder particle 11a may include Cu powder, Ag powder, or the like, but is not limited thereto. The metal particle 11 may have a spherical or flake shape, but is not limited thereto. The base resin 12 may be a thermosetting resin such as an epoxy resin, but is not limited thereto. The first and second resin layers 131b and 132b may be formed by coating the first and second electrode layers 131a and 132a with the conductive resin compound including the metal particle 11 and the base resin 12 and curing the conductive resin compound.

The electronic component 100 may be mounted on the circuit board 200 by the conductive adhesive 310. The conductive adhesive 310 may be formed by applying the conductive resin compound to the external electrode 130 of the electronic component 100 and curing the conductive resin compound, after the electronic component 100 is disposed on the circuit board 200. Alternatively, the conductive adhesive 310 may be formed by applying the conductive resin compound to the external electrode 130 of the electronic component 100, disposing the electronic component 100 together with the applied conductive resin compound on the circuit board 200, and then curing the conductive resin compound.

The conductive adhesive 310 may include first and second conductive adhesives 311 and 312 respectively connected to the first and second external electrodes 131 and 132. More specifically, the first and second conductive adhesives 311 and 312 may be respectively connected to the first and second resin layers 131b and 132b of the first and second external electrodes 131 and 132. In addition, the first and second conductive adhesives 311 and 312, like the first and second resin layers 131b and 132b of the first and second external electrodes 131 and 132, may include a conductive resin, that is, the metal particle 11 and the base resin 12. The metal particle 11 may include the metal powder particle 11a coated with a noble metal or alloys thereof 11b. Here, the noble metal or the alloy thereof 11b may include at least one of Au, Ag, Pt, Ru, Rh, Pd, Os, and Ir, but is not limited thereto. The metal powder particle 11a may include Cu powder, Ag powder, or the like, but is not limited thereto. The metal particle 11 may have a spherical or flake shape, but is not limited thereto. The base resin 12 may be a thermosetting resin such as an epoxy resin, but is not limited thereto. The first and second conductive adhesives 311 and 312 may be formed by applying the conductive resin compound to the first and second resin layers 131b and 132b of the electronic component 100 to connect the first and second resin layers 131b and 132b of the electronic component 100 to the first and second electrode pads 221 and 222 of the circuit board 200 and curing the conductive resin compound, after the electronic component 100 is disposed on the circuit board 200. Alternatively, the first and second conductive adhesives 311 and 312 may be formed by applying the conductive resin compound on the first and second resin layers 131b and 132b of the electronic component 100, arranging the electronic component 100 together with the applied conductive resin compound on the circuit board 200, and then curing the conductive resin compound.

In such a manner, the electronic component 100, such as the MLCC, according to the exemplary embodiment may be mounted on the electrode pad 220 of the circuit board 200 by the conductive adhesive 310 including the conductive resin, not by soldering. Since the external electrode 130 connected to the conductive adhesive 310 also includes conductive resin, crack generation due to warpage of the circuit board 200 may be reduced, and excellent adhesion may be ensured. In addition, since a solder material is not used, solder joint cracks may not be generated by abrupt changes in temperature. Further, since the solder material is not used, the electronic component 100 may be utilized for applications used at a temperature of 150° C. or more. In addition, since the solder material is not used, it may be advantageous to reduce acoustic noise.

The circuit board 200 may include the substrate 210 and the electrode pad 220 formed on the substrate 210. The electrode pad 220 may be formed on the substrate 210, but is not limited thereto. The electrode pad 220 may be embedded in the substrate 210, and only an upper portion thereof may be exposed. That is, the electrode pad 220 may be disposed on or in the substrate 210. The circuit board 200 may be a printed circuit board (PCB) well-known in the art.

The substrate 210 may be one of various types of substrates used in PCBs. For example, the substrate 210 may be a mainboard of an electronic device, an interposer substrate of a package, or the like, but is not limited thereto. Although not shown in the drawings, various circuit patterns may be formed on the substrate 210. A material of the substrate 210 is not be specifically limited, and may be changed depending on a specific type of the circuit board 200. For example, the substrate 210 may be an insulating substrate including an insulating material, such as an epoxy resin or a polyimide resin. In some exemplary embodiments, the substrate 210 may be a ceramic plate or a metal plate, but is not limited thereto. More detailed descriptions of the substrate 210 are omitted.

The electrode pad 220 may allow the electronic component 100 to be physically mounted on the substrate 210 and the circuit board 200 to be electrically connected to the electronic component 100. The electrode pad 220 may include the first and second electrode pads 221 and 222 disposed to be spaced apart from each other on the substrate 210. The first and second electrode pads 221 and 222 may be respectively connected to the first and second external electrodes 131 and 132 via the first and second conductive adhesives 311 and 312. A material of the electrode pad 220 is not specifically limited, and a conductive material well-known in the art, such as a metal or a solder material, may be used with no specific limitation.

Figure 4:
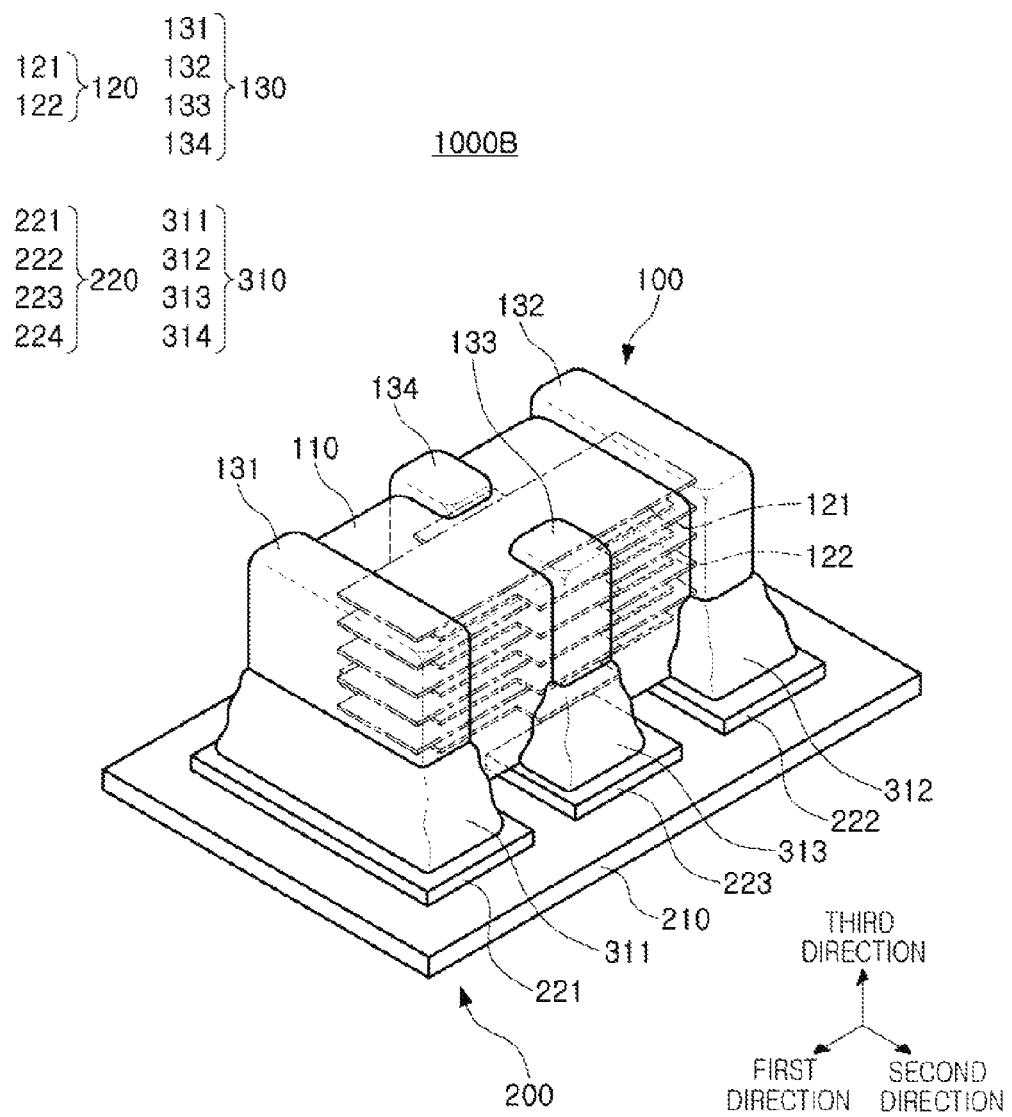
FIG. 4 is a perspective view schematically illustrating an electronic component-mounting circuit board according to another exemplary embodiment of present disclosure.

FIG. 4 is a perspective view schematically illustrating an electronic component-mounting circuit board according to another exemplary embodiment of present disclosure.

Figure 5A:
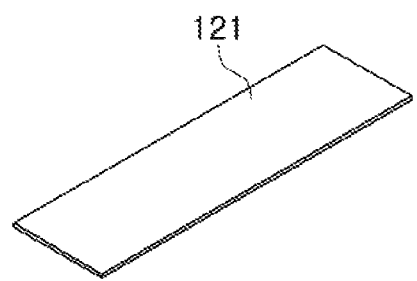
FIGS. 5A and 5B are perspective views schematically illustrating an internal electrode of the electronic component in FIG. 4.
Figure 5B:
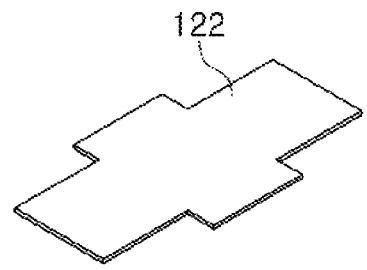

FIG. 5 is a perspective view schematically illustrating an internal electrode of the electronic component in FIG. 4.

Referring to FIGS. 4 and 5, an electronic component-mounting circuit board 1000B according to the exemplary embodiment includes a circuit board 200 including a substrate 210 and an electrode pad 220 formed on the substrate 210, an electronic component 100 including a body 110 which has a dielectric material 111 and an internal electrode 120 embedded in the dielectric material 111 and an external electrode 130 connected to the internal electrode 120 and disposed on the body 110, and a conductive adhesive 310 connecting the electrode pad 220 to the external electrode 130. Here, the external electrode 130 and the conductive adhesive 310 may include a conductive resin 15. The conductive adhesive 310 may be a subcomponent of the electronic component 100. That is, the electronic component 100 may include the conductive adhesive 310.

Hereinafter, a configuration of the electronic component-mounting circuit board 1000B according to the exemplary embodiment is described in more detail. However, descriptions duplicated with those described above will be omitted.

The internal electrode 120 of the electronic component 100 may include first internal electrodes 121 exposed on first and second surfaces opposing each other in a first direction of the body 110, and second internal electrodes 122 exposed on third and fourth surfaces opposing each other in a second direction of the body 110. The first and second internal electrodes 121 and 122 may be alternately disposed with the dielectric material 111 therebetween.

The external electrode 130 of the electronic component 100 may include first and second external electrodes 131 and 132 respectively covering the first and second surfaces opposing each other in the first direction of the body 110, and third and fourth external electrodes 133 and 134 respectively covering center portions of the third and fourth surfaces opposing each other in the second direction of the body 110. The first and second external electrodes 131 and 132 may be connected to the first internal electrodes 121. The third and fourth external electrodes 133 and 134 may be connected to the second internal electrodes 122. Each of the first to fourth external electrodes 131, 132, 133, and 134 may include an electronic layer and a resin layer as described above. Here, the resin layer may include a conductive resin.

The conductive adhesive 310 of the electronic component 100 may include first to fourth conductive adhesives 311, 312, 313, and 314 respectively connected to the first to fourth external electrodes 131, 132, 133, and 134 and respectively connecting the first to fourth external electrodes 131, 132, 133, and 134 to first to fourth electrode pads 221, 222, 223, and 224 of the circuit board 200, which will be described later. The first to fourth conductive adhesives 311, 312, 313, and 314 may include a conductive resin as described above.

The electrode pad 220 of the circuit board 200 may include the first to fourth electrode pads 221, 222, 223, and 224 respectively connected to the first to fourth conductive adhesives 311, 312, 313, and 314. The first to fourth electrode pads 221, 222, 223, and 224 may be disposed to be spaced apart from each other on the substrate 210.

Figure 6:
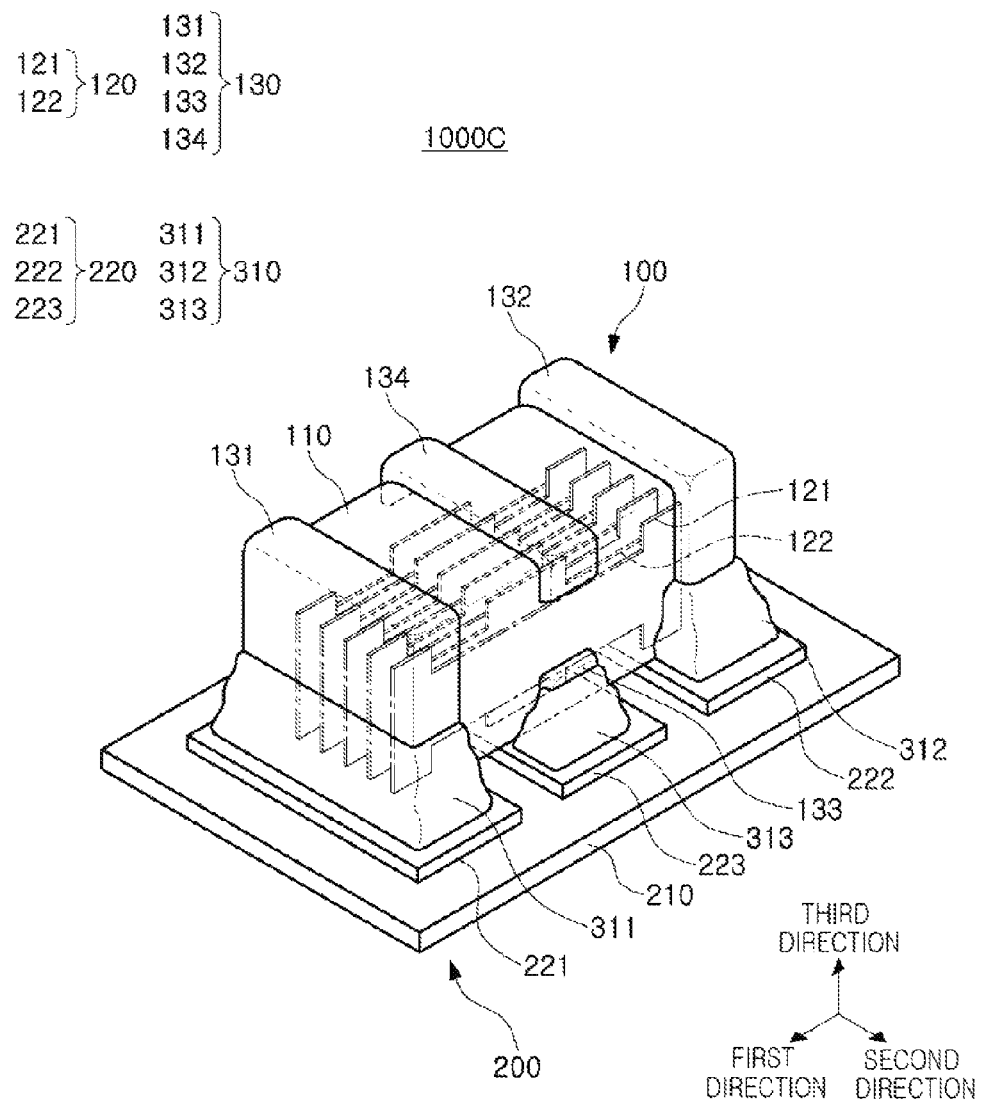
FIG. 6 is a perspective view schematically illustrating an electronic component-mounting circuit board according to another exemplary embodiment of the present disclosure.

FIG. 6 is a perspective view schematically illustrating an electronic component-mounting circuit board according to another exemplary embodiment of the present disclosure.

Figure 7A:
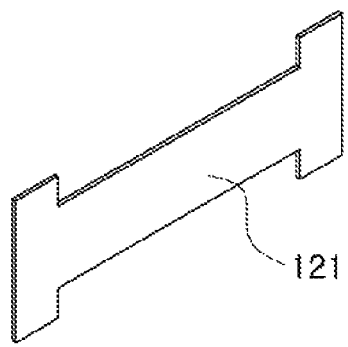
FIGS. 7A and 7B are perspective views schematically illustrating an internal electrode of the electronic component in FIG. 6.
Figure 7B:
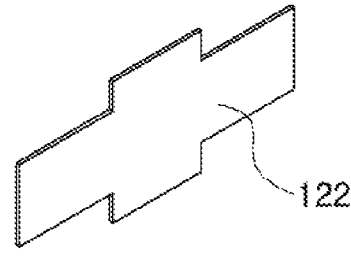

FIG. 7 is a perspective view schematically illustrating an internal electrode of the electronic component in FIG. 6.

Referring to FIGS. 6 and 7, an electronic component-mounting circuit board 1000C according to the exemplary embodiment may include a circuit board 200 including a substrate 210 and an electrode pad 220 formed on the substrate 210, an electronic component 100 including a body 110 having a dielectric material 111 and an internal electrode 120 embedded in the dielectric material 111 and an external electrode 130 connected to the internal electrode 120 and disposed on the body 110, and a conductive adhesive 310 connecting the electrode pad 220 to the external electrode 130. Here, the external electrode 130 and the conductive adhesive 310 may include a conductive resin 15. The conductive adhesive 310 may be a subcomponent of the electronic component 100. That is, the electronic component 100 may include the conductive adhesive 310.

Hereinafter, a configuration of the electronic component-mounting circuit board 1000C according to the exemplary embodiment will be described in more detail. However, descriptions that same as those described above will be omitted.

The internal electrode 120 of the electronic component 100 may include first internal electrodes 121 exposed on first and second surfaces opposing each other in a first direction of the body 110, and second internal electrodes 122 exposed on fifth and seventh surfaces opposing each other in a third direction of the body 110. The first and second internal electrodes 121 and 122 may be alternately disposed with the dielectric material 111 therebetween. The first and second internal electrodes 121 and 122 may be disposed perpendicularly to amounting surface of the substrate 210 of the circuit board 200.

The external electrode 130 of the electronic component 100 may include first and second external electrodes 131 and 132 respectively covering the first and second surfaces opposing each other in the first direction of the body 110, and third and fourth external electrodes 133 and 134 respectively covering center portions of the fifth and seventh surfaces opposing each other in the third direction of the body 110. The first and second external electrodes 131 and 132 may be connected to the first internal electrodes 121. The third and fourth external electrodes 133 and 134 may be connected to the second internal electrodes 122. Each of the first to fourth external electrodes 131, 132, 133, and 134 may include an electrode layer and a resin layer as described above. Here, the resin layer may include a conductive resin.

The conductive adhesive 310 of the electronic component 100 may include first to third conductive adhesives 311, 312, and 313 respectively connected to the first to third external electrodes 131, 132, and 133 and respectively connecting the first to third external electrodes 131, 132, and 133 to first to third electrode pads 221, 222, and 223 of the circuit board 200, which will be described later. The first to third conductive adhesives 311, 312, and 313 may include a conductive resin as described above.

The electrode pad 220 of the circuit board 200 may include the first to third electrode pads 221, 222, and 223 respectively connected to the first to third conductive adhesives 311, 312, and 313. The first to third electrode pads 221, 222, and 223 may be disposed to be spaced apart from each other on the substrate 210.

Beside the above-described structures, other well-known structures of an electronic component and a circuit board having the same may be applied. In addition, it is obvious that these structures may be modified for some purpose. That is, any modifications may be possible as long as an external electrode and a conductive adhesive include a conductive resin.

Figure 8:
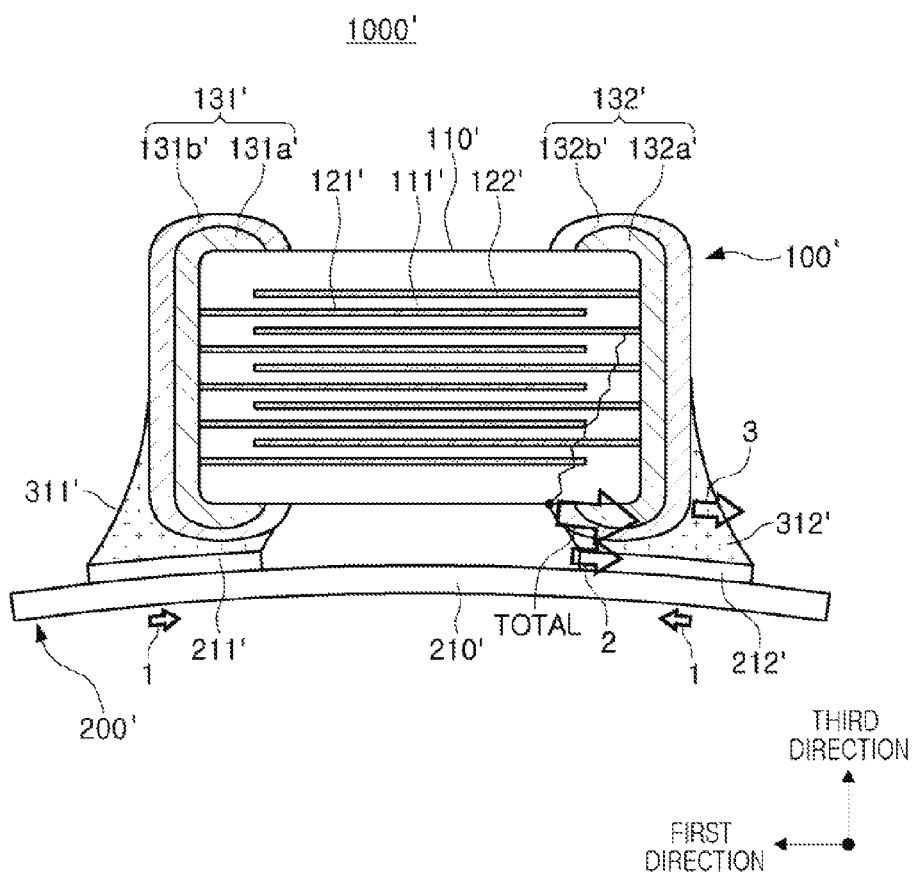
FIG. 8 is a cross-sectional view schematically illustrating cracks generated in an electronic component mounted on a circuit board.

FIG. 8 is a cross-sectional view schematically illustrating cracks generated in an electronic component mounted on a circuit board.

Referring to FIG. 8, an electronic component-mounting circuit board 1000' having cracks and mounted on a circuit board may include a circuit board 200' including a substrate 210' and first and second electrode pads 221' and 222' formed on the substrate 210', an electronic component 100' including a body 110' having a dielectric material 111' and first and second internal electrodes 121' and 122' embedded in the dielectric material 111', first and second copper layers 131a' and 132a' respectively connected to the first and second internal electrodes 121' and 122' and disposed on the body 110', and first and second nickel/tin layers 131b' and 132b' covering the first and second copper layers 131a' and 132a', and first and second soldering materials 311' and 312' connecting the first and second internal electrodes 121' and 122' to the first and second nickel/tin layers 131b' and 132b'. That is, an external electrode has no conductive resin, and the electronic component 100' may be mounted on the circuit board 200' by soldering.

Here, due to warpage of the circuit board 200', three types of stresses may be generated. More specifically, a total stress applied to the electronic component 100' from a starting point of application (a black dot) may be represented by the sum of a compressive stress 1 applied along a bottom surface of the substrate 210', a tensile stress 2 applied along a top surface of the substrate 210', and a tensile stress 3 generated due to shrinkage of the soldering materials 311' and 312'. When a strain caused by the total stress applied to the electronic component 100' exceeds a limit strain of the electronic component 100', the crack may be generated. Such cracks may electrically short circuit the electronic component 100', thereby generating a critical defect leading to firing of the circuit. That is, when an external electrode does not include a conductive resin, and an electronic component is mounted on a circuit board by soldering, it is difficult to solve the problem such as cracking.

As set forth above, the electronic component and the circuit board having the same according to the exemplary embodiments of the present disclosure provide a noble metal structure in which crack generation can be reduced when the electronic component is mounted on a circuit board.

Throughout the specification, it will be understood that when an element is referred to as being "connected to" another element, it can be directly "connected to" the other element, or other elements intervening therebetween, such as an adhesive layer, may be present. In addition, it will be understood that when an element is referred to as being "electrically connected to" another element, it can be physically "connected to" the other element, or may not be physically "connected to" the other element. In addition, it will be apparent that though the terms first, second, third, etc. may be used herein to describe various members, components, regions, layers, and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

In the present specification, "an exemplary embodiment" of the present disclosure indicates that the exemplary embodiment described may include a particular feature, structure, or characteristic, but every exemplary embodiment may not necessarily include that particular feature, structure, or characteristic. Moreover, the expression "an exemplary embodiment" is not necessarily referring to the same exemplary embodiment. Further, when a particular feature, structure, or characteristic is described in connection with an exemplary embodiment, it is within the knowledge of those skilled in the art to affect such feature, structure, or characteristic in connection with other exemplary embodiments whether or not explicitly described.

The terminology used herein is for describing particular embodiments only and is not intended to be limiting. As used herein, the singular forms "a," "an," and "the" are intended to include the plural forms as well, unless the context clearly indicates otherwise.

While example embodiments have been shown and described above, it will be apparent to those skilled in the art that modifications and variations could be made without departing from the scope of the invention as defined by the appended claims.

What is claimed is:

1. An electronic component, comprising:
a body including a dielectric material and an internal electrode embedded in the dielectric material;
an external electrode disposed on the body, connected to the internal electrode, and including a resin layer; and
a conductive adhesive connected to the external electrode,
wherein the resin layer of the external electrode and the conductive adhesive are made of a same material including a conductive resin,
the conductive resin includes a metal and a base resin,
the metal includes a metal powder coated with a noble metal or alloys thereof, and
the metal powder is a different material from the coated noble metal or alloys.

2. The electronic component of claim 1, wherein the resin layer of the external electrode is in contact with the conductive adhesive.

3. The electronic component of claim 1, wherein the base resin includes an epoxy resin.

4. The electronic component of claim 1, wherein the noble metal or the alloy thereof includes at least one of gold (Au), silver (Ag), platinum (Pt), ruthenium (Ru), rhodium (Rh), palladium (Pd), osmium (Os) and iridium (Ir).

5. The electronic component of claim 1, wherein the metal powder includes at least one of Cu powder and Ag powder.

6. The electronic component of claim 1, wherein the external electrode further comprises an electrode layer disposed on the body and connected to the internal electrode; and
the resin layer is disposed between the conductive adhesive and the electrode layer.

7. The electronic component of claim 6, wherein the electrode layer includes Cu.

8. The electronic component of claim 1, wherein the internal electrode includes first and second internal electrodes alternately disposed with the dielectric layer therebetween,
the external electrode includes first and second external electrodes disposed to be spaced apart from each other and respectively connected to the first and second internal electrodes, and the conductive adhesive includes first and second conductive adhesives respectively connected to the first and second external electrodes.

9. The electronic component of claim 1, wherein the electronic component is a multilayer ceramic capacitor.

10. The electronic component of claim 1, wherein the conductive adhesive does not completely cover the external electrode.

11. The electronic component of claim 1, wherein the external electrode and the conductive adhesive contain no soldering material.

12. An electronic component-mounting circuit board, comprising:
    a circuit board including a substrate and an electrode pad formed on the substrate;
    an electronic component including a body having a dielectric material and an internal electrode embedded in the dielectric material, and an external electrode connected to the internal electrode, disposed on the body, and including a resin layer; and
    a conductive adhesive configured to connect the electrode pad to the external electrode,
    wherein the resin layer of the external electrode and the conductive adhesive are made of a same material including a conductive resin,
    the conductive resin includes a metal and a base resin,
    the metal includes a metal powder coated with a noble metal or alloys thereof, and
    the metal powder is a different material from the coated noble metal or alloys.

13. The electronic component-mounting circuit board of claim 12, wherein the resin layer of the external electrode is in contact with the conductive adhesive.

14. The electronic component-mounting circuit board of claim 12, wherein the electronic component and the circuit board are electrically connected to each other not by any soldering material.

* * * * *